US012562710B2

(12) United States Patent
Noguchi et al.

(10) Patent No.: US 12,562,710 B2
(45) Date of Patent: Feb. 24, 2026

(54) ACOUSTIC WAVE FILTER AND MULTIPLEXER

(71) Applicant: Murata Manufacturing Co., Ltd., Nagaokakyo (JP)

(72) Inventors: Akira Noguchi, Nagaokakyo (JP); Yasunori Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 343 days.

(21) Appl. No.: 18/204,977

(22) Filed: Jun. 2, 2023

(65) Prior Publication Data

US 2023/0402992 A1      Dec. 14, 2023

(30) Foreign Application Priority Data

Jun. 8, 2022    (JP) ................................. 2022-093212

(51) Int. Cl.
    *H03H 9/02* (2006.01)
    *H03H 9/13* (2006.01)
    *H03H 9/145* (2006.01)
(52) U.S. Cl.
    CPC ........ *H03H 9/02637* (2013.01); *H03H 9/131* (2013.01); *H03H 9/132* (2013.01); *H03H 9/133* (2013.01); *H03H 9/145* (2013.01)
(58) Field of Classification Search
    CPC ........ H03H 9/132; H03H 9/131; H03H 9/133; H03H 9/568; H03H 9/14541; H03H 9/6436; H03H 9/6483; H03H 9/725
    USPC .......... 333/193; 310/313 A, 313 R, 363–365
    See application file for complete search history.

(56) References Cited

U.S. PATENT DOCUMENTS

| | | | | |
|---|---|---|---|---|
| 2002/0125576 A1* | 9/2002 | Koyama | ............. | H01L 23/5258 |
| | | | | 257/E23.15 |
| 2004/0188774 A1* | 9/2004 | Takeda | ................. | H10D 84/013 |
| | | | | 257/E21.619 |
| 2011/0199163 A1* | 8/2011 | Yamanaka | ......... | H03H 9/14582 |
| | | | | 331/158 |
| 2014/0049340 A1* | 2/2014 | Inoue | .................... | H03H 9/725 |
| | | | | 333/195 |
| 2020/0204152 A1* | 6/2020 | Yamada | .................. | H01L 24/03 |
| 2021/0119611 A1* | 4/2021 | Koreeda | ................ | H03H 9/145 |

FOREIGN PATENT DOCUMENTS

| | | | | |
|---|---|---|---|---|
| EP | 0795958 A2 * | 9/1997 | .......... | H03H 9/6483 |
| JP | 2020-088846 A | 6/2020 | | |

* cited by examiner

*Primary Examiner* — Andrea Lindgren Baltzell
*Assistant Examiner* — Victor Cole
(74) *Attorney, Agent, or Firm* — Keating & Bennett, LLP

(57)            ABSTRACT

An acoustic wave filter includes a filter circuit and an additional circuit that includes IDTs and reflectors. The IDTs each include comb-shaped electrode fingers. The reflectors each include reflector electrode fingers. A relationship of about $0.60+n \leq G/(Pi+Pr) \leq 0.93+n$ is satisfied, where n is an integer of 0 or more, Pi is an array pitch of the comb-shaped electrode fingers arranged along a second direction, Pr is an array pitch of the reflector electrode fingers arranged along the second direction, and G denotes, in boundary regions between the IDTs and the reflectors, an IDT-reflector gap, which is a center-to-center distance between a comb-shaped electrode finger closest to the reflectors and a reflector electrode finger closest to the IDTs.

20 Claims, 8 Drawing Sheets

FIG. 5

| PARAMETERS | DATA |
|---|---|
| CUT-ANGLE $[°]$ | 35 |
| FILM THICKNESS OF LiTaO₃ $[nm]$ | 1500 |
| FILM THICKNESS OF SiO₂ $[nm]$ | 1000 |
| THICKNESS OF SiN $[nm]$ | 900 |
| PLANE ORIENTATION OF SILICON | (111) |
| THICKNESS OF SILICON $[μm]$ | 125 |
| THICKNESS OF ELECTRODE Ti-AlCu-Ti $[nm]$ | 30-425-4 |
| THICKNESS OF PROTECTIVE FILM SiO₂ $[nm]$ | 50 |

FIG. 6

| ELECTRODE PARAMETERS | ACOUSTIC WAVE RESONATORS | | | | | | |
|---|---|---|---|---|---|---|---|
| | S1 | P1 | S2 | P2 | S3 | P3 | S4 |
| NUMBER OF PAIRS IN IDT | 100 | 145 | 60 | 62 | 56 | 86 | 60 |
| NUMBER OF PAIRS IN REFLECTOR | 10 | 10 | 10 | 10 | 10 | 10 | 10 |
| INTERSECTING WIDTH IN IDT $[μm]$ | 80.6 | 109.3 | 82.0 | 251.0 | 110.0 | 173.9 | 141.4 |
| DUTY IN IDT | 0.45 | 0.45 | 0.45 | 0.45 | 0.45 | 0.45 | 0.45 |
| DUTY IN REFLECTOR | 0.45 | 0.45 | 0.45 | 0.45 | 0.45 | 0.45 | 0.45 |
| IDT WAVELENGTH $[μm]$ | 5.2061 | 5.5810 | 5.2354 | 5.5443 | 5.2547 | 5.5838 | 5.2317 |
| REFLECTOR WAVELENGTH $[μm]$ | 5.4348 | 5.5810 | 5.4941 | 5.5443 | 5.4834 | 5.5838 | 5.4758 |
| GAP RATIO GR | 0.4043 | 0.42 | 0.4133 | 0.46 | 0.4333 | 0.42 | 0.4153 |

FIG. 7

| ELECTRODE PARAMETERS | REFLECTOR 41 | ACOUSTICALLY-COUPLED RESONATOR 25 | | | | REFLECTOR 42 |
|---|---|---|---|---|---|---|
| | | IDT31 | | IDT32 | | |
| | | FIRST ELECTRODE FINGER GROUP 37 | SECOND ELECTRODE FINGER GROUP 38 | SECOND ELECTRODE FINGER GROUP 38 | FIRST ELECTRODE FINGER GROUP 37 | |
| NUMBER OF PAIRS | 6 | 2 | 1 | 1 | 2 | 9 |
| INTERSECTING WIDTH [μm] | | 51 | 51 | 51 | 51 | |
| DUTY | 0.4500 | 0.4500 | 0.4500 | 0.4500 | 0.4500 | 0.4500 |
| ARRAY PITCH [μm] | 2.38030 | 2.40600 | 2.30400 | 2.27575 | 2.48500 | 2.38030 |
| GAP RATIO | $GR = G/(Pi+Pr) = 0.73$ | $g1/(Pi+Pr) = 0.44$ | $g12/(Pi+Pr) = 0.47$ | $g2/(Pi+Pr) = 0.47$ | | $GR = G/(Pi+Pr) = 0.73$ |

ACOUSTIC WAVE FILTER AND MULTIPLEXER

CROSS REFERENCE TO RELATED APPLICATIONS

This application claims the benefit of priority to Japanese Patent Application No. 2022-093212 filed on Jun. 8, 2022. The entire contents of this application are hereby incorporated herein by reference.

BACKGROUND OF THE INVENTION

1. Field of the Invention

The present invention relates to an acoustic wave filter and a multiplexer.

2. Description of the Related Art

In the related art, an acoustic wave filter including a filter circuit, and an additional circuit connected in parallel with the filter circuit is disclosed in, for example, Japanese Unexamined Patent Application Publication No. 2020-88846. The additional circuit is a circuit that generates a cancel signal for, of a signal transmitted by the filter circuit, a signal component outside a pass band. The additional circuit is constituted by a plurality of interdigital transducers (IDTs) disposed along an acoustic wave propagation direction, and two reflectors disposed such that the plurality of IDTs are located between the reflectors.

In the acoustic wave filter including the additional circuit, however, strong excitation sometimes occurs in the additional circuit, resulting in deterioration of attenuation characteristics outside the pass band.

SUMMARY OF THE INVENTION

Preferred embodiments of the present invention provide acoustic wave filters that are each able to reduce or prevent deterioration of attenuation characteristics outside a pass band.

An acoustic wave filter according to a preferred embodiment of the present invention includes an input terminal and an output terminal, a filter circuit on a first path connecting the input terminal and the output terminal, and an additional circuit on a second path connected in parallel with at least a portion of the first path. The additional circuit includes an acoustically-coupled resonator including a plurality of interdigital transducers (IDTs) and a plurality of reflectors. The plurality of IDTs each include a pair of comb-shaped electrodes on a piezoelectric substrate. Each of the comb-shaped electrodes includes a plurality of comb-shaped electrode fingers extending in a first direction parallel or substantially parallel to a main surface of the piezoelectric substrate and disposed along a second direction intersecting the first direction. The plurality of IDTs are located along the second direction. The plurality of reflectors are located on both outer sides of the plurality of IDTs in the second direction and each include a plurality of reflector electrode fingers extending in the first direction and arranged along the second direction. A relationship of about $0.60+n \leq G/(Pi+Pr) \leq 0.93+n$ is satisfied, where n is an integer of 0 or more, Pi denotes an array pitch of the plurality of comb-shaped electrode fingers along the second direction, Pr denotes an array pitch of the plurality of reflector electrode fingers along the second direction, and G denotes, in a boundary region between the IDT and the reflector, an IDT-reflector gap, which is a center-to-center distance between one of the plurality of comb-shaped electrode fingers closest to the reflector and one of the plurality of reflector electrode fingers closest to the IDT.

A multiplexer according to a preferred embodiment of the present invention includes an acoustic wave filter according to a preferred embodiment of the present invention, and another filter circuit with a pass band different from a pass band of the acoustic wave filter.

Preferred embodiments of the present invention each reduce or prevent deterioration of attenuation characteristics outside the pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a table illustrating parameters of a piezoelectric substrate and an electrode defining the acoustically-coupled resonator.

FIG. 6 is a table illustrating electrode parameters of acoustic wave resonators included in a filter circuit in Practical Example of a preferred embodiment of the present invention.

FIG. 7 is a table illustrating electrode parameters of IDTs and reflectors included in the additional circuit in Practical Example.

DETAILED DESCRIPTION OF THE PREFERRED EMBODIMENTS

A preferred embodiment of the present invention will be described with reference to FIGS. 1 and 2.

Figure 1:
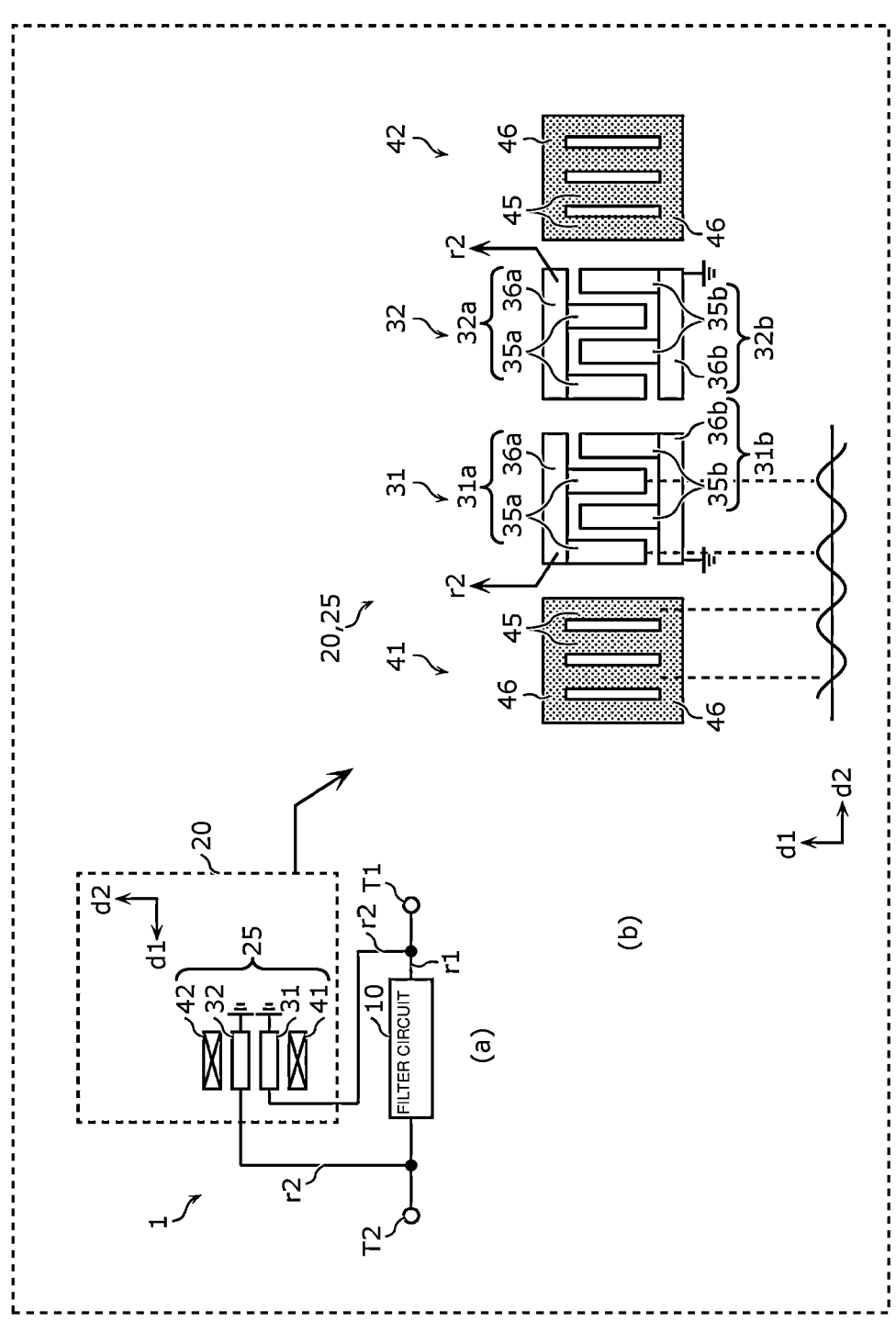
FIG. 1 includes diagrams illustrating an acoustic wave filter according to a preferred embodiment of the present invention, and an additional circuit included in the acoustic wave filter.

FIG. 1 includes diagrams illustrating an acoustic wave filter 1 according to a preferred embodiment, and an additional circuit 20 included in the acoustic wave filter 1. FIG. 1A illustrates the acoustic wave filter 1 according to the present preferred embodiment, and FIG. 1B illustrates the additional circuit 20 and a phase of an acoustic wave in an IDT 31.

As illustrated in FIG. 1A, the acoustic wave filter 1 includes a filter circuit 10 provided on a first path r1 connecting an input terminal T1 and an output terminal T2, and the additional circuit 20 provided on a second path r2 connected in parallel with the first path r1.

The additional circuit 20 is a circuit to cancel an unwanted wave generated outside a pass band (for example, in an attenuation band) of the filter circuit 10. That is, the additional circuit 20 is a circuit that outputs a cancel signal. A signal output by the filter circuit 10 in a predetermined frequency band is opposite in phase to a cancel signal in the predetermined frequency band. Outside the pass band of the filter circuit 10, a signal output by the filter circuit 10 is cancelled out by a cancel signal, and thus the out-of-band attenuation of the filter circuit 10 can be increased.

The additional circuit 20 includes an acoustically-coupled resonator 25. The acoustically-coupled resonator 25 is, for example, a longitudinally coupled acoustic wave resonator. The acoustically-coupled resonator 25 may not be a longitudinally coupled acoustic wave resonator, and may be, for example, a transversal acoustic wave resonator.

As illustrated in FIG. 1B, the additional circuit 20 includes a plurality of IDTs 31 and 32 and a plurality of reflectors 41 and 42. Of the plurality of IDTs 31 and 32, the IDT 31 is connected to the second path r2 on an input terminal T1 side, and the IDT 32 is connected to the second path r2 on an output terminal T2 side. That is, of the plurality of IDTs 31 and 32, one IDT 31 is connected to the second path r2 on one side, and the IDT 32 different from the one IDT 31 is connected to the second path r2 on the other side.

Each of the plurality of IDTs 31 and 32 includes an IDT electrode including a pair of comb-shaped electrodes. The IDT 31 includes a pair of a first comb-shaped electrode 31*a* and a second comb-shaped electrode 31*b*, and the IDT 32 includes a pair of a first comb-shaped electrode 32*a* and a second comb-shaped electrode 32*b*. Each comb-shaped electrode is provided on a piezoelectric substrate 100 (see FIG. 4B).

Each of the first comb-shaped electrodes 31*a* and 32*a* includes a plurality of comb-shaped electrode fingers 35*a* and a busbar electrode 36*a*. The comb-shaped electrode fingers 35*a* extend in a first direction d1 parallel or substantially parallel to a main surface of the piezoelectric substrate 100 and are arranged along a second direction d2 intersecting the first direction d1.

The busbar electrode 36*a* connects one ends of the plurality of comb-shaped electrode fingers 35*a* to each other and is disposed so as to extend in the second direction d2. In FIG. 1B, the first direction d1 and the second direction d2 perpendicularly or substantially perpendicularly intersect each other. The first direction d1 and the second direction d2 do not necessarily perpendicularly or substantially perpendicularly intersect each other.

Each of the second comb-shaped electrodes 31*b* and 32*b* includes a plurality of comb-shaped electrode fingers 35*b* and a busbar electrode 36*b*. The comb-shaped electrode fingers 35*b* extend in the first direction d1 and are arranged along the second direction d2. The busbar electrode 36*b* connects one ends of the plurality of comb-shaped electrode fingers 35*b* to each other and is disposed so as to extend in the second direction d2.

The plurality of IDTs 31 and 32 are disposed along the second direction d2. The comb-shaped electrode fingers 35*a* and 35*b* interdigitate with each other in the first direction d1 and are disposed in parallel to each other. Incidentally, in the present preferred embodiment, the second direction d2 is a direction orthogonal to the first direction d1 and is the same direction as an acoustic wave propagation direction of the IDTs 31 and 32.

The first comb-shaped electrodes 31*a* and 32*a* are connected to the second path r2, and the second comb-shaped electrodes 31*b* and 32*b* are connected to a ground. That is, the comb-shaped electrode fingers 35*a* and the busbar electrode 36*a* are set at signal potential, and the comb-shaped electrode fingers 35*b* and the busbar electrode 36*b* are set at ground potential.

The plurality of reflectors 41 and 42 are disposed on both outer sides of the plurality of IDTs 31 and 32 such that the plurality of IDTs 31 and 32 are located therebetween in the second direction d2. Each of the reflectors 41 and 42 includes a plurality of reflector electrode fingers 45 and a plurality of reflector busbars 46. The reflector electrode fingers 45 extend in the first direction d1 and are arranged along the second direction d2. Each reflector busbar 46 connects one ends or the other ends of the plurality of reflector electrode fingers 45 to each other and is disposed so as to extend in the second direction d2.

In the additional circuit 20 according to the present preferred embodiment, the comb-shaped electrode fingers 35*a* and 35*b* are alternately arranged at a predetermined pitch along the second direction d2, and the reflector electrode fingers 45 are arranged at the predetermined pitch along the second direction d2. On the other hand, a distance between the IDT 31 and the reflector 41 is a distance different from the predetermined pitch.

Figure 2:
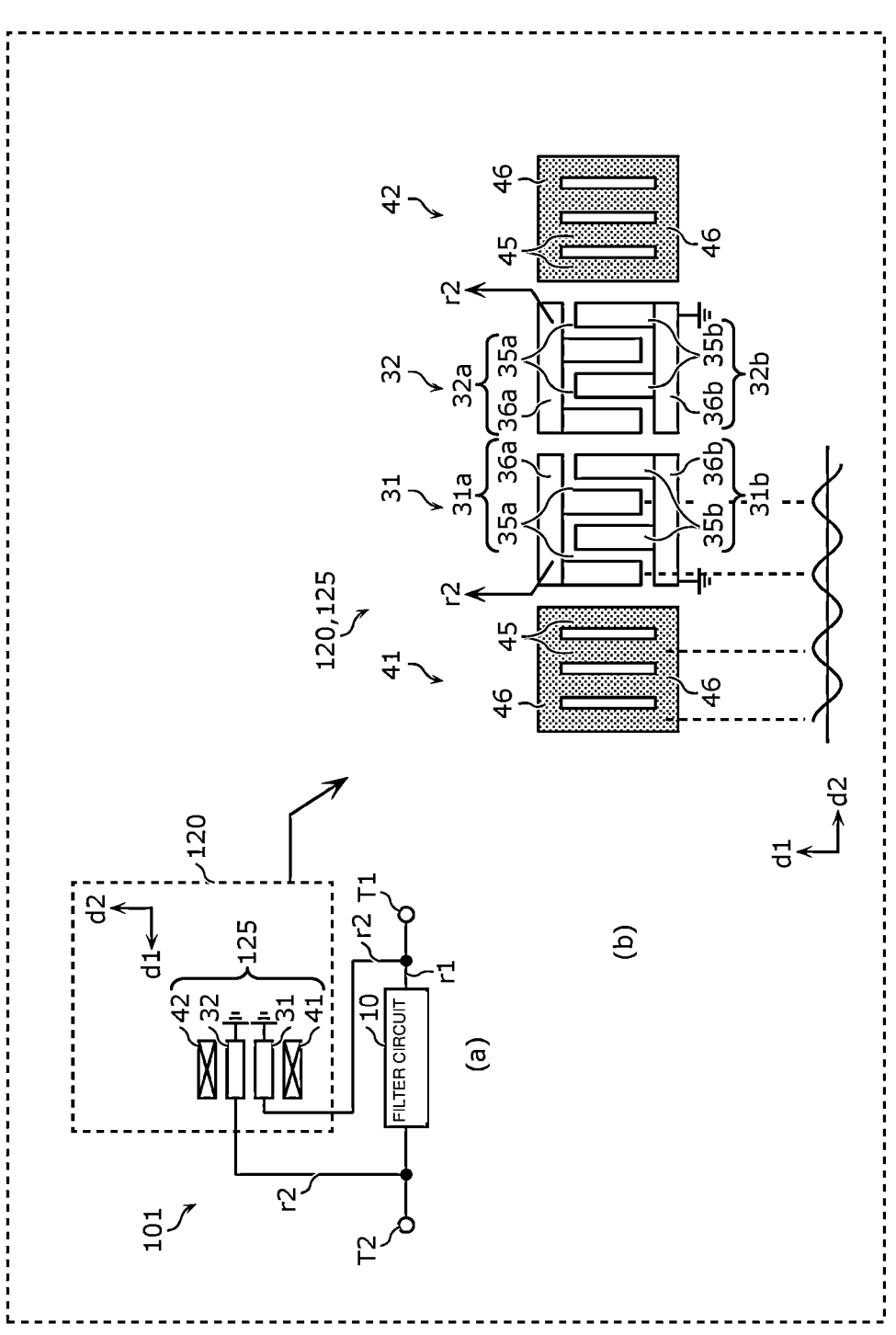
FIG. 2 includes diagrams illustrating an acoustic wave filter in a comparative example, and an additional circuit included in the acoustic wave filter.

FIG. 2 includes diagrams illustrating an acoustic wave filter 101 in a comparative example, and an additional circuit 120 included in the acoustic wave filter 101. FIG. 2A illustrates the acoustic wave filter 101 in the comparative example, and FIG. 2B illustrates the additional circuit 120 and a phase of an acoustic wave in the IDT 31.

The acoustic wave filter 101 in the comparative example includes the filter circuit 10 and the additional circuit 120. The filter circuit 10 in the comparative example has the same or substantially the same configuration as the filter circuit 10 according to the present preferred embodiment.

As in the present preferred embodiment, in the additional circuit 120 in the comparative example, the comb-shaped electrode fingers 35*a* and 35*b* are alternately arranged at a predetermined pitch, and the reflector electrode fingers 45 are arranged at the predetermined pitch. However, the distance between the IDT 31 and the reflector 41 is the same or substantially the same distance as the above predetermined pitch, and thus an acoustic wave phase based on the IDT 31 coincides with an acoustic wave phase based on the reflector 41 to raise the possibility of the occurrence of strong excitation in an acoustically-coupled resonator 125 of the additional circuit 120. For this reason, in the comparative example, attenuation characteristics outside a pass band of the acoustic wave filter 101 may sometimes deteriorate.

On the other hand, in the present preferred embodiment, the distance between the IDT 31 and the reflector 41 is different from the predetermined pitch as described above. For example, when an appropriate distance between the IDT 31 and the reflector 41 is provided while maintaining this distance relationship in which the distance is different from the predetermined pitch, a phase shift between an acoustic wave phase based on the IDT 31 and an acoustic wave phase based on the reflector 41 can be produced. This can prevent the acoustically-coupled resonator 25 of the additional circuit 20 from being overexcited and reduce deterioration of attenuation characteristics outside the pass band of the acoustic wave filter 1. Although the distance between one IDT 31 and one reflector 41 has been described above, the same holds true for a distance between the other IDT 32 and the other reflector 42.

Preferred embodiments of the present invention will be described in detail below with reference to the drawings. All of the preferred embodiments to be described below describe comprehensive or specific examples. Numerical values, shapes, materials, components, the arrangement and connection configuration of the components, and so forth that are described in the following preferred embodiments are merely examples and are not intended to limit the present invention. Of components in the following preferred embodiments, a component not described in an independent claim is described as an optional component.

Furthermore, the sizes or size ratio of components illustrated in drawings are or is not necessarily exact. Additionally, in the figures, components that are the same or substantially the same are denoted by the same reference signs, and a repeated description thereof is omitted or simplified in some cases. Furthermore, in the following preferred embodiments, when an element is referred to as being "connected" to another element, the element can not only be directly connected to the other element, but also electrically via another element or the like.

Preferred Embodiment

Configuration of Multiplexer

A configuration of a multiplexer including the acoustic wave filter 1 according to a preferred embodiment will be described with reference to FIG. 3.

Figure 3:
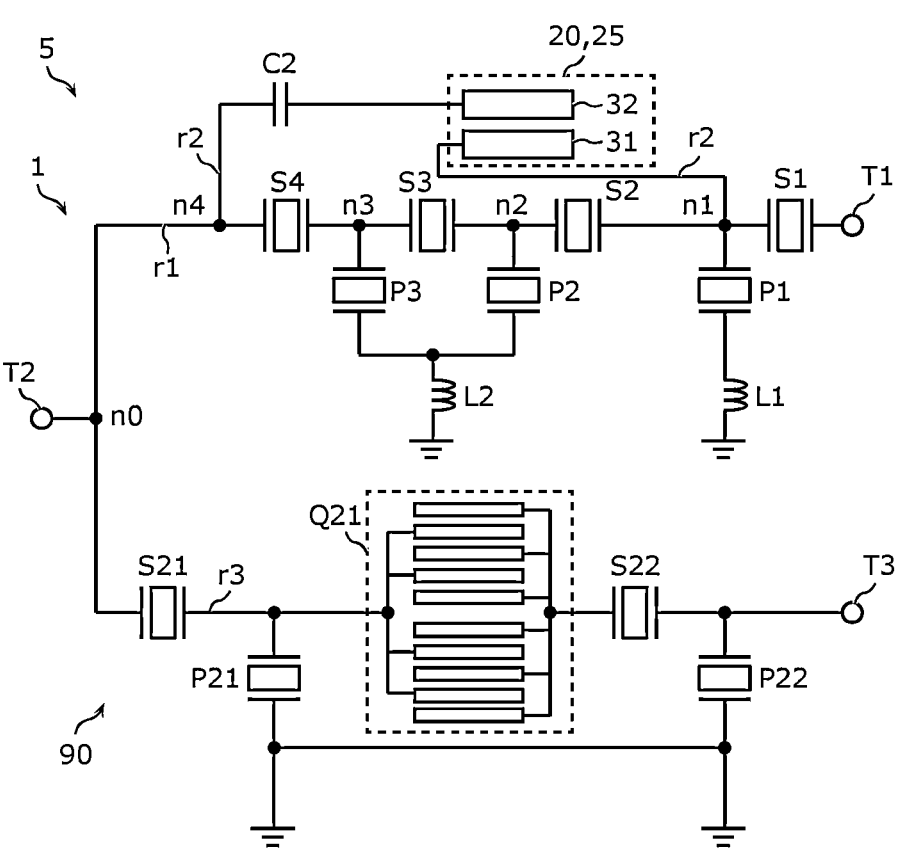
FIG. 3 illustrates a circuit configuration of a multiplexer including the acoustic wave filter according to the preferred embodiment of the present invention.

FIG. 3 illustrates a circuit configuration of a multiplexer 5 including the acoustic wave filter 1.

The multiplexer 5 is a splitter or combiner including a plurality of filters. The multiplexer 5 includes the acoustic wave filter 1 including a first filter circuit 10 and the additional circuit 20, and a second filter circuit 90. The first filter circuit 10 is a filter circuit having a first frequency band as a pass band.

Furthermore, the multiplexer 5 includes the input terminal T1 connected to the acoustic wave filter 1, the output terminal T2 connected to both the acoustic wave filter 1 and the second filter circuit 90, and an output terminal T3 connected to the second filter circuit 90.

The input terminal T1 is a signal input side terminal of the acoustic wave filter 1. For example, the input terminal T1 is connected to an RF signal processing circuit (not illustrated) via an amplifier circuit or the like (not illustrated).

The output terminal T2 is a signal output side terminal of the acoustic wave filter 1 and is also a signal input side terminal of the second filter circuit 90. The output terminal T2 is a common terminal of the acoustic wave filter 1 and the second filter circuit 90 and is connected to, for example, an antenna element (not illustrated). For the output terminal T2, one path branching off at, as a branch point, a node n0 between the acoustic wave filter 1 and the output terminal T2 is connected to the acoustic wave filter 1, and the other path branching off at the node n0 is connected to the second filter circuit 90.

The output terminal T3 is a signal output side terminal of the second filter circuit 90. For example, the output terminal T3 is connected to the RF signal processing circuit (not illustrated) via an amplifier circuit or the like (not illustrated).

The acoustic wave filter 1 is disposed on the first path r1 connecting the input terminal T1 and the output terminal T2. The acoustic wave filter 1 includes the first filter circuit 10, and the additional circuit 20 additionally connected to the first filter circuit 10. A radio-frequency signal input to the input terminal T1 passes through the first path r1 and the second path r2 connected in parallel with at least part of the first path r1 and is output from the output terminal T2.

The first filter circuit 10 is a filter circuit having, as a pass band, the first frequency band specified by a communication standard. The acoustic wave filter 1 including the first filter circuit 10 is a transmission filter having, for example, an uplink frequency band (transmission band) as a pass band and is configured so that its pass band is lower than that of the second filter circuit 90.

The additional circuit 20 is provided on the second path r2. The additional circuit 20 includes two IDTs 31 and 32 disposed along the second direction d2. A radio-frequency signal transmitted through the second path r2 is input to one IDT 31 and is output from the other IDT 32. The reflectors 41 and 42 are omitted from FIG. 3.

The second filter circuit 90 is disposed on a third path r3 connecting the output terminal (common terminal) T2 and the output terminal T3. The second filter circuit 90 has, as a pass band, a frequency band different from the pass band of the first filter circuit 10. The second filter circuit 90 is a reception filter having, for example, a downlink frequency band (reception band) as a pass band. The second filter circuit 90 includes, for example, a plurality of series-arm resonators S21 and S22, a plurality of parallel-arm resonators P21 and P22, and an acoustic wave resonator Q21.

The series-arm resonator S21, the acoustic wave resonator Q21, and the series-arm resonator S22 are connected in series in sequence from the output terminal (common terminal) T2 to the output terminal T3. The parallel-arm resonator P21 is disposed on a path connecting a node between the series-arm resonator S21 and the acoustic wave resonator Q21 and the ground. The parallel-arm resonator P22 is disposed on a path connecting a node between the series-arm resonator S22 and the output terminal T3 and the ground. The acoustic wave resonator Q21 is defined by longitudinally coupled acoustic wave resonators connected in parallel.

Characteristics are demanded of each of the acoustic wave filter 1 and the second filter circuit 90 in which frequencies in its own band are passed and frequencies in another band located outside its own band are attenuated.

Configuration of Acoustic Wave Filter

A configuration of the acoustic wave filter 1 will be described with reference to FIG. 3. As illustrated in FIG. 3, the acoustic wave filter 1 includes the first filter circuit 10 and the additional circuit 20.

The first filter circuit 10 includes series-arm resonators S1, S2, S3, and S4, and parallel-arm resonators P1, P2, and P3, which are acoustic wave resonators. Each acoustic wave resonator is a surface acoustic wave (SAW) resonator including an IDT and a reflector.

The series-arm resonators S1 to S4 are disposed on the first path r1 connecting the input terminal T1 and the output terminal T2. The series-arm resonators S1 to S4 are connected in series in sequence from the input terminal T1 to the output terminal T2.

The parallel-arm resonators P1 to P3 are connected in parallel with one another on paths connecting nodes n1, n2, and n3 between the series-arm resonators S1 to S4 and the ground (reference terminal). Specifically, of the parallel-arm resonators P1 to P3, one end of the parallel-arm resonator P1 closest to the input terminal T1 is connected to the node n1 between the series-arm resonators S1 and S2, and the other end is connected to the ground via an inductor L1. One end of the parallel-arm resonator P2 is connected to the node n2 between the series-arm resonators S2 and S3, and the other end is connected to the ground via an inductor L2. One end of the parallel-arm resonator P3 is connected to the node n3 between the series-arm resonators S3 and S4, and the other end is connected to the ground via the inductor L2. The other ends of the parallel-arm resonators P2 and P3 are connected in common to the inductor L2.

Thus, the first filter circuit 10 has, for example, a ladder filter structure including four series-arm resonators S1 to S4 disposed on the first path r1 and three parallel-arm resonators P1 to P3 disposed on the paths connecting the first path r1 and the ground. For the series-arm resonators and parallel-arm resonators defining the first filter circuit 10, the number of series-arm resonators and the number of parallel-arm resonators are not limited to four or three. One or more series-arm resonators and one or more parallel-arm resonators only have to be provided. Furthermore, in FIG. 3, some of the parallel-arm resonators are connected in common to the ground. However, a decision on whether to make a common connection or individual connections to the ground can be made appropriately, for example, in accordance with a constraint of an installation layout of the first filter circuit 10.

The additional circuit 20 includes the plurality of IDTs 31 and 32 as described above. The IDT 31 is connected to the first path r1 on the input terminal T1 side as viewed from the series-arm resonators S1 to S4, specifically, to the node n1 between the series-arm resonator S1 and the series-arm resonator S2. The IDT 32 is connected to the first path r1 on the output terminal T2 side as viewed from the series-arm resonators S1 to S4, specifically, to a node n4 between the node n0 and the series-arm resonator S4. On a path connecting the IDT 32 and the node n4, a reactance element C2 is provided. The node n4 may be located at the same location as the node n0.

The additional circuit 20 applies a signal of opposite phase to an unwanted wave, which is a signal in the attenuation band, to cancel out an unwanted wave component and improves attenuation in the attenuation band. A signal of opposite phase is provided by connecting the acoustically-coupled resonator 25 of the additional circuit 20 in parallel with the filter circuit 10. In this example, a signal phase obtained in the second path r2 on an IDT 32 side is opposite to a signal phase obtained in the second path r2 on an IDT 31 side, and a signal of opposite phase is therefore applied to the filter circuit 10 by connecting this acoustically-coupled resonator 25 in parallel with the filter circuit 10. Thus, an unwanted wave component in the attenuation band is cancelled out, and attenuation in the attenuation band is improved. Furthermore, the additional circuit 20 according to the present preferred embodiment has the following configuration to keep strong excitation from occurring in the additional circuit Configuration of Additional Circuit A configuration of the additional circuit 20 will be described with reference to FIGS. 4 and 5.

Figure 4:
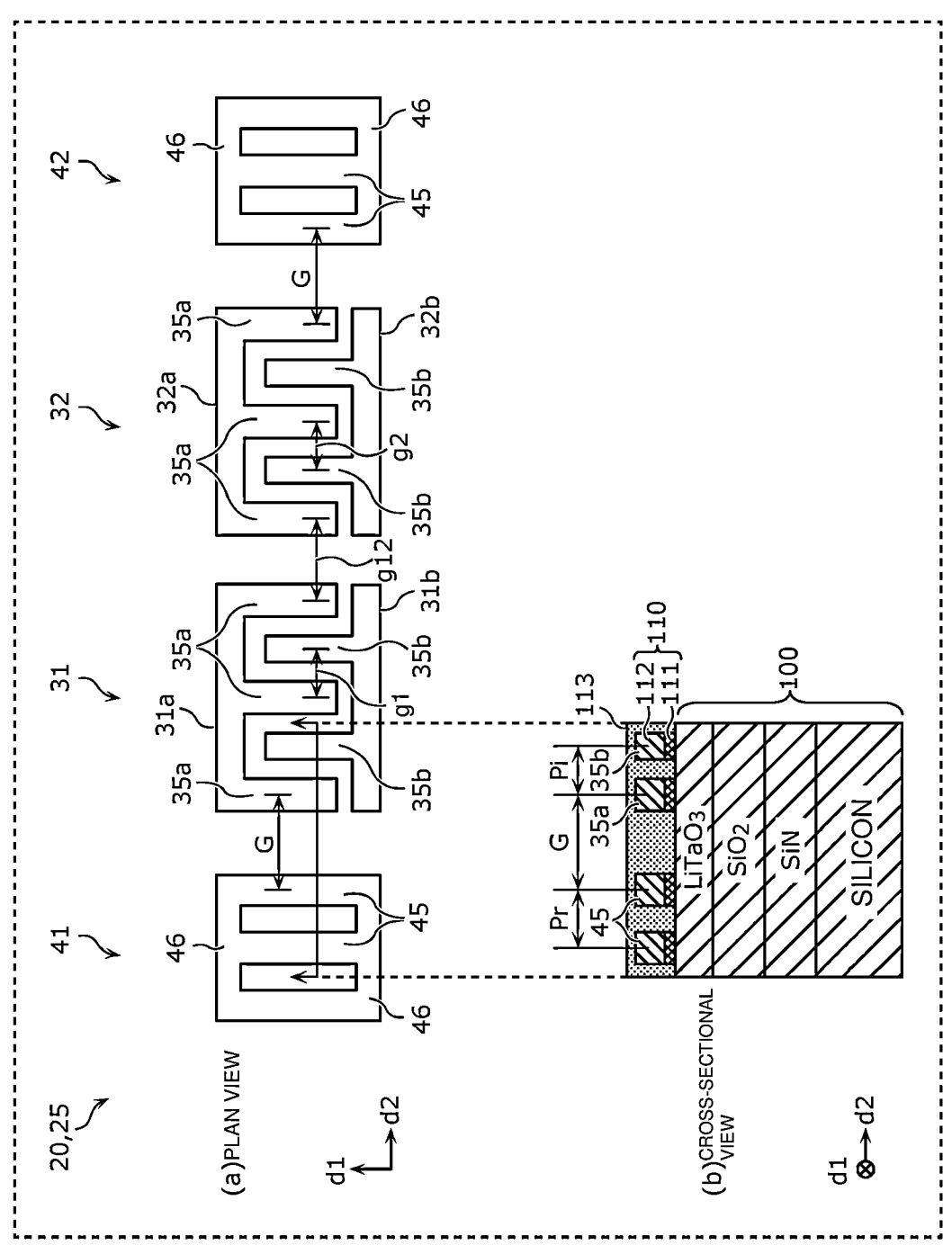
FIG. 4 includes views illustrating an electrode structure and a cross-sectional structure of an acoustically-coupled resonator defining the additional circuit.

FIG. 4 includes views illustrating an electrode structure and a cross-sectional structure of the acoustically-coupled resonator 25 defining the additional circuit 20. FIG. 5 is a table illustrating parameters of the piezoelectric substrate 100 and an electrode defining the acoustically-coupled resonator 25. FIG. 4A is a plan view of the acoustically-coupled resonator 25, and FIG. 4B is a cross-sectional view of a portion of the acoustically-coupled resonator 25.

The acoustically-coupled resonator 25 illustrated in FIG. 4 is intended to describe a typical structure of a resonator, and the number of electrode fingers, the length of each electrode finger, and so forth are not limited to this. The typical structure of the resonator illustrated in FIG. 4 is also applied to acoustic wave resonators defining the filter circuit 10.

As illustrated in FIG. 4, the acoustically-coupled resonator 25 includes the piezoelectric substrate 100, an electrode 110, and a protective film 113. The acoustically-coupled resonator 25 includes the IDTs 31 and 32 and the reflectors 41 and 42 that are defined by the piezoelectric substrate 100, the electrode 110, and the protective film 113. The acoustically-coupled resonator 25 according to the present preferred embodiment is, for example, an surface acoustic wave resonator including the IDTs 31 and 32 and the reflectors 41 and 42.

The electrode 110 of the IDTs 31 and 32 and the reflectors 41 and 42 has a laminated structure including a close contact layer 111 and a main electrode layer 112.

The close contact layer 111 is a layer to improve close contact between the piezoelectric substrate 100 and the main electrode layer 112, and an example of a material used is Ti.

The main electrode layer 112 has a laminated structure including, for example, Ti, AlCu, and Ti in sequence from bottom to top. As illustrated in FIG. 5, Ti, AlCu, and Ti are respectively, for example, about 30 nm, about 425 nm, and about 4 nm in thickness.

The protective film 113 covers the electrode 110. The protective film 113 is a layer, for example, to protect the main electrode layer 112 from an external environment, to adjust frequency-temperature characteristics, and to increase resistance to moisture. For example, the protective film 113 is a film including silicon dioxide ($SiO_2$) as a main component. As illustrated in FIG. 5, a film thickness of the protective film 113 is, for example, about 50 nm.

Materials of which the close contact layer 111, the main electrode layer 112, and the protective film 113 are made are not limited to the above-described materials. Furthermore, the electrode 110 does not have to have the above-described laminated structure. The electrode 110 may be made of, for example, a metal, such as Ti, Al, Cu, Pt, Au, Ag, or Pd, or an alloy of the metal, or may be defined by a plurality of multilayer bodies made of the above-described metal or alloy. Furthermore, the protective film 113 does not have to be provided.

The piezoelectric substrate 100 has a laminated structure including a supporting substrate, a high acoustic velocity film, a low acoustic velocity film, and a piezoelectric layer in sequence. The high acoustic velocity film is a film in which a bulk wave that propagates through the film is higher in acoustic velocity than an acoustic wave that propagates along the piezoelectric layer. The low acoustic velocity film is a film in which a bulk wave that propagates through the film is lower in acoustic velocity than a bulk wave that propagates through the piezoelectric layer. In the cross-sectional view in FIG. 4, silicon corresponds to the supporting substrate, SiN corresponds to the high acoustic velocity film, $SiO_2$ corresponds to the low acoustic velocity film, and $LiTaO_3$ corresponds to the piezoelectric layer.

The piezoelectric substrate 100 according to the present preferred embodiment has a laminated structure including, for example, on the silicon substrate, SiN, $SiO_2$, and $LiTaO_3$ in sequence as illustrated in FIG. 4B. As illustrated in FIG. 5, for example, a thickness of the silicon substrate is about 125 μm, a plane orientation of silicon is (111), a thickness of SiN is about 900 nm, a film thickness of $SiO_2$ is about 1000 nm, a film thickness of $LiTaO_3$ is about 1500 nm, and a cut-angle of $LiTaO_3$ is about 35°.

The thickness of SiN, the film thickness of $SiO_2$, and the film thickness of $LiTaO_3$ are not limited to the parameters illustrated in FIG. 5 and may be, for example, about 300 nm, about 673 nm, and about 1000 nm. The thicknesses of Ti, AlCu, and Ti may be respectively, for example, about 30 nm, about 365 nm, and about 4 nm. The piezoelectric layer is not limited to $LiTaO_3$ and may be, for example, $LiNbO_3$. The piezoelectric substrate 100 may be a substrate including, as at least a component, a piezoelectric layer. The piezoelectric substrate 100 may be, for example, a substrate made of a 0° Y-cut X-propagation $LiNbO_3$ piezoelectric single crystal or piezoelectric ceramics (a lithium niobate single crystal or ceramics that are cut at a plane normal to an axis rotated about an X axis through 0° from a Y axis to a Z axis-direction and along which an surface acoustic wave propagates in an X-axis direction).

Here, an array pitch of the comb-shaped electrode fingers 35a and 35b arranged along the second direction d2 as illustrated in FIG. 4 is Pi. Specifically, the array pitch Pi of the comb-shaped electrode fingers 35a and 35b refers to, in a plurality of comb-shaped electrode fingers 35a and 35b included in the plurality of IDTs 31 and 32, a distance between centers in the second direction d2 of comb-shaped electrode fingers 35a and 35b adjacent to each other (hereinafter, a distance between centers in the second direction d2 of two electrode fingers may be referred to as simply "center-to-center distance"). All of array pitches of the plurality of comb-shaped electrode fingers 35a and 35b included in the plurality of IDTs 31 and 32 may be the same, or some or all of the array pitches may be different. Array pitches of the comb-shaped electrode fingers 35a and 35b may vary discontinuously such that adjacent pitches in the second direction d2 are irregularly increased or decreased.

The array pitch Pi of the comb-shaped electrode fingers 35a and 35b can be derived as follows. For example, the total number of comb-shaped electrode fingers 35a and 35b included in the plurality of IDTs 31 and 32 is Ni. A center-to-center distance between, in the plurality of IDTs 31 and 32, a comb-shaped electrode finger located at one end and a comb-shaped electrode finger located at the other end in the second direction d2 is Di. The array pitch Pi is represented by the following expression: Pi=Di/(Ni−1). It can be said that (Ni−1) is the total number of gaps between adjacent comb-shaped electrode fingers in the plurality of IDTs 31 and 32.

As a substitute for a measurement point of the array pitch Pi, a distance on a virtual line passing through a substantial midpoint in the first direction d1 of an intersecting width of predetermined adjacent comb-shaped electrode fingers and being parallel to the second direction d2 can be used. For a method of measuring the array pitch Pi, for example, a length measurement can be made through optical microscope or SEM observation from top (a direction perpendicular or substantially perpendicular to both the first direction d1 and the second direction d2), or through optical microscope or SEM observation of a cross-section, which passes through the above-described virtual line, taken, for example, by grinding.

Furthermore, an array pitch of the reflector electrode fingers 45 arranged along the second direction d2 as illustrated in FIG. 4 is Pr. Specifically, the array pitch Pr of the reflector electrode fingers 45 refers to, in a plurality of reflector electrode fingers 45 included in the reflectors 41 and 42, a center-to-center distance between reflector electrode fingers 45 adjacent to each other in the second direction d2. All of array pitches of the plurality of reflector electrode fingers 45 included in the reflectors 41 and 42 may be the same, or some or all of the array pitches may be different. Array pitches of the reflector electrode fingers 45 may vary discontinuously such that adjacent pitches in the second direction d2 are irregularly increased or decreased.

The array pitch Pr of the reflector electrode fingers 45 can be derived as follows. For example, the total number of reflector electrode fingers 45 included in the reflector 41 is Nr. A center-to-center distance between, in the reflector 41, a reflector electrode finger located at one end and a reflector electrode finger located at the other end in the second direction d2 is Dr. The array pitch Pr is represented by the following expression: Pr=Dr/(Nr−1). It can be said that (Nr−1) is the total number of gaps between adjacent reflector electrode fingers in the reflector 41. The same holds true for the reflector 42. As a substitute for a measurement point of the array pitch Pr, for example, a distance on a virtual line passing through a substantial midpoint in the first direction d1 of an intersecting width of predetermined adjacent reflector electrode fingers and being parallel to the second direction d2 can be used. For a method of measuring the array pitch Pr, for example, a length measurement can be made through optical microscope or SEM observation from top (a direction perpendicular or substantially perpendicular to both the first direction d1 and the second direction d2), or through optical microscope or SEM observation of a cross-section, which passes through the above-described virtual line, taken, for example, by grinding.

Furthermore, as illustrated in FIG. 4, in a boundary region between an IDT (for example, 31) and a reflector (for example, 41), an IDT-reflector gap, which is a center-to-center distance in the second direction d2 between, of the plurality of comb-shaped electrode fingers 35a and 35b, a comb-shaped electrode finger (for example, 35a) closest to the reflector 41 and, of a plurality of reflector electrode fingers 45, a reflector electrode finger closest to the IDT 31, is G.

Under the above definition, in the additional circuit 20 of the acoustic wave filter 1 according to the present preferred embodiment, a relationship of about 0.60+n≤G/(Pi+Pr) ≤0.93+n is satisfied, where n is an integer of 0 or more. This configuration can appropriately make acoustic wave phases based on the IDTs 31 and 32 different from acoustic wave phases based on the reflectors 41 and 42 and keep the acoustically-coupled resonator 25 of the additional circuit 20 from being overexcited. Thus, deterioration of attenuation characteristics outside the pass band of the acoustic wave filter 1 can be reduced or prevented.

Attenuation Characteristics and others of Acoustic Wave Filter

Attenuation characteristics and others of acoustic wave filters in Practical Example of preferred embodiments of the present invention and Comparative Examples will be described with reference to FIGS. 6 to 9.

First, electrode parameters of the filter circuit 10 and the acoustically-coupled resonator 25, which constitutes the additional circuit 20, that are included in the acoustic wave filter 1 in Practical Example will be described. Practical Example is an example of the preferred embodiment described above.

FIG. 6 is a table illustrating electrode parameters of acoustic wave resonators included in the filter circuit 10 in Practical Example. FIG. 6 illustrates electrode parameters of IDTs and reflectors of the series-arm resonators S1 to S4 and parallel-arm resonators P1 to P3 of the filter circuit 10. Specifically, for each acoustic wave resonator, there are illustrated the number of pairs in an IDT, the number of pairs in each reflector, an intersecting width in the IDT, duty in the IDT, duty in the reflector, an IDT wavelength, and a reflector wavelength.

Furthermore, in FIG. 6, a gap ratio, which is a ratio of an IDT-reflector gap G to an acoustic wave resonator wavelength, is illustrated. This gap ratio is a value obtained by dividing the IDT-reflector gap G by the sum of one-half of the IDT wavelength and one-half of the reflector wavelength. One-half of the IDT wavelength is the same as an array pitch of electrode fingers in the IDT, and one-half of the reflector wavelength is the same as an array pitch of electrode fingers in the reflector.

FIG. 7 is a table illustrating electrode parameters of the IDTs 31 and 32 and reflectors 41 and 42 included in the additional circuit 20 in Practical Example.

FIG. 7 illustrates the number of pairs and duty in each of the IDTs 31 and 32 and reflectors 41 and 42, and intersecting widths of electrode fingers in the IDTs 31 and 32. The number of pairs of electrode fingers in each of the IDTs 31 and 32 is one-half of the number of comb-shaped electrode fingers 35a and 35b, and the number of pairs in each of the reflectors 41 and 42 is one-half of the number of reflector electrode fingers 45. In this example, the number of pairs in each of the IDTs 31 and 32 is smaller than the number of pairs in each of the reflectors 41 and 42. A duty is a value obtained by dividing an electrode finger width by an array pitch of electrode fingers. In this example, the IDTs 31 and 32 and the reflectors 41 and 42 are have the same or substantially the same duty. An intersecting width is a measurement of an overlap between the comb-shaped electrode finger 35a and the comb-shaped electrode finger 35b when the IDTs 31 and 32 are viewed from the second direction d2. In this example, an intersecting width in the IDT 31 is the same or substantially the same as an intersecting width in the IDT 32.

FIG. 7 illustrates array pitches of electrode fingers in the IDTs 31 and 32 and the reflectors 41 and 42. Each of the IDTs 31 and 32 includes a plurality of electrode finger groups having different array pitches of the comb-shaped electrode fingers 35a and 35b. Specifically, each of the IDTs 31 and 32 includes a first electrode finger group 37 having a wide array pitch of the comb-shaped electrode fingers 35a and 35b, and a second electrode finger group 38 having an array pitch narrower than the first electrode finger group 37. In this example, the first electrode finger group 37 and the second electrode finger group 38 in the IDT 31 and the second electrode finger group 38 and the first electrode finger group 37 in the IDT 32 are arranged in sequence along the second direction d2. An array pitch of the first electrode finger group 37 in the IDT 31 is wider than the array pitch Pr of the reflector electrode fingers 45 in the reflector 41, and an array pitch of the second electrode finger group 38 in the IDT 31 is narrower than the array pitch Pr of the reflector electrode fingers 45 in the reflector 41. An array pitch of the first electrode finger group 37 in the IDT 32 is wider than the array pitch Pr of the reflector electrode fingers 45 in the reflector 42, and an array pitch of the second electrode finger group 38 in the IDT 32 is narrower than the array pitch Pr of the reflector electrode fingers 45 in the reflector 42.

Furthermore, FIG. 7 illustrates a gap between electrode fingers. The gap refers to, in terms of two components including electrode fingers, a center-to-center distance in the second direction d2 between an electrode finger in one component closest to the other component and an electrode finger in the other component closest to the one component.

Specifically, in FIG. 7, a gap ratio GR, which is a ratio of an IDT-reflector gap G to a wavelength of the acoustically-coupled resonator 25, is illustrated. The gap ratio GR in the present preferred embodiment is a value obtained by dividing the IDT-reflector gap G by the sum of the array pitch Pi of the comb-shaped electrode fingers 35a and 35b and the array pitch Pr of the reflector electrode fingers 45 and is represented by GR=G/(Pi+Pr). Pi+Pr, which is the denominator, represents the average of wavelengths of the IDTs 31 and 32 and wavelengths of the reflectors 41 and 42. A gap ratio GR in a boundary region between the IDT 31 and the reflector 41 is a value obtained by dividing the IDT-reflector gap G that is a gap between the reflector 41 and the IDT 31 by the sum of the array pitch Pi and the array pitch Pr. In this example, an IDT-reflector gap G=about 3.438 μm, an array pitch Pi=about 2.3047 μm, and an array pitch Pr=about 2.3803 μm, and the gap ratio GR in the boundary region between the IDT 31 and the reflector 41 is about 0.73. Furthermore, a gap ratio GR in a boundary region between the IDT 32 and the reflector 42 is a value obtained by dividing the IDT-reflector gap G that is a gap between the IDT 32 and the reflector 42 by the sum of the array pitch Pi and the array pitch Pr. In this example, an IDT-reflector gap G=about 3.438 μm, an array pitch Pi=about 2.3047 μm, and an array pitch Pr=about 2.3803 μm, and the gap ratio GR in the boundary region between the IDT 32 and the reflector 42 is about 0.73.

A value (g1/(Pi+Pr)) obtained by dividing a gap g1 between the first electrode finger group 37 and the second electrode finger group 38 that are included in the IDT 31 by the sum of the array pitch Pi and the array pitch Pr is about 0.44. A value (g12/(Pi+Pr)) obtained by dividing a gap g12 between the second electrode finger group 38 in the IDT 31 and the second electrode finger group 38 in the IDT 32 by the sum of the array pitch Pi and the array pitch Pr is about 0.47. A value (g2/(Pi+Pr)) obtained by dividing a gap g2 between the second electrode finger group 38 and the first electrode finger group 37 that are included in the IDT 32 by the sum of the array pitch Pi and the array pitch Pr is about 0.47.

Next, the insertion loss of the acoustic wave filter having the electrode parameters illustrated in FIGS. 6 and 7 will be described.

Figure 8:
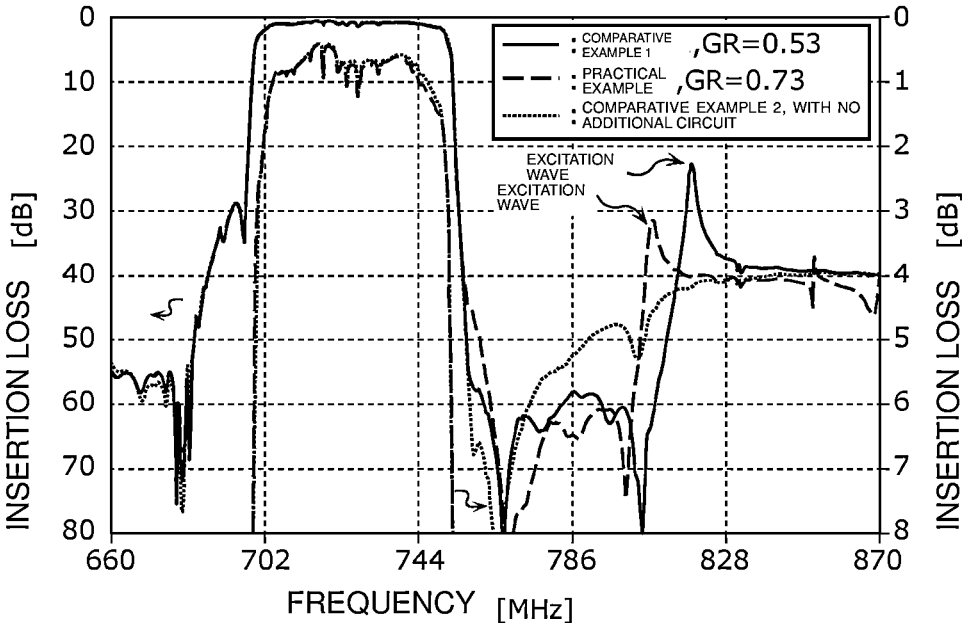
FIG. 8 is a graph illustrating insertion loss of each of acoustic wave filters in Practical Example and Comparative Examples 1 and 2.

FIG. 8 is a graph illustrating insertion loss of each of acoustic wave filters in Practical Example and Comparative Examples 1 and 2.

The acoustic wave filter 1 in Practical Example is a filter having the electrode parameters illustrated in FIGS. 6 and 7. The acoustic wave filter 101 in Comparative Example 1 is a filter in which the gap ratio GR (=G/(Pi+Pr)) is about 0.53 and in which the other electrode parameters are the same or substantially the same as in Practical Example 1. In Comparative Example 1, an IDT-reflector gap G=about 2.483 μm, an array pitch Pi=about 2.3047 μm, and an array pitch Pr=about 2.3803 μm, and the gap ratio GR in the boundary region between the IDT and the reflector is about 0.53. An acoustic wave filter in Comparative Example 2 is a filter including no additional circuit and is defined only by the filter circuit 10. Pass bands of the acoustic wave filters in Practical Example and Comparative Examples 1 and 2 range from a frequency of about 703 MHz to a frequency of about 748 MHz.

As illustrated in FIG. 8, in a range of about 760 MHz to about 800 MHz, which is an attenuation band on a higher-frequency side than the pass band, insufficient attenuation is exhibited in Comparative Example 2, whereas large attenuation is exhibited in Practical Example and Comparative Example 1. That is, in comparison with the acoustic wave filter including no additional circuit, the acoustic wave filters including the additional circuit can provide attenuation in the range of about 760 MHz to about 800 MHz, which is an attenuation band. Practical Example can provide more attenuation in the range of about 760 MHz to about 800 MHz than that in Comparative Example 1.

Furthermore, as illustrated in FIG. 8, in Comparative Example 1, an unintended excitation wave caused by, for example, a strong rebound due to the reflectors occurs near about 818 MHz, which is a frequency higher than the range of about 760 MHz to about 800 MHz, and attenuation characteristics deteriorate. On the other hand, in Practical Example, a peak value of an excitation wave is smaller than that in Comparative Example 1 near about 810 MHz, which is a frequency higher than the range of about 760 MHz to about 800 MHz, and the excitation wave can be reduced. When the gap ratio GR in the additional circuit is about 0.73 as in Practical Example, deterioration of attenuation characteristics outside the pass band can be reduced in comparison with a case where the gap ratio GR is about 0.53 as in Comparative Example.

Figure 9:
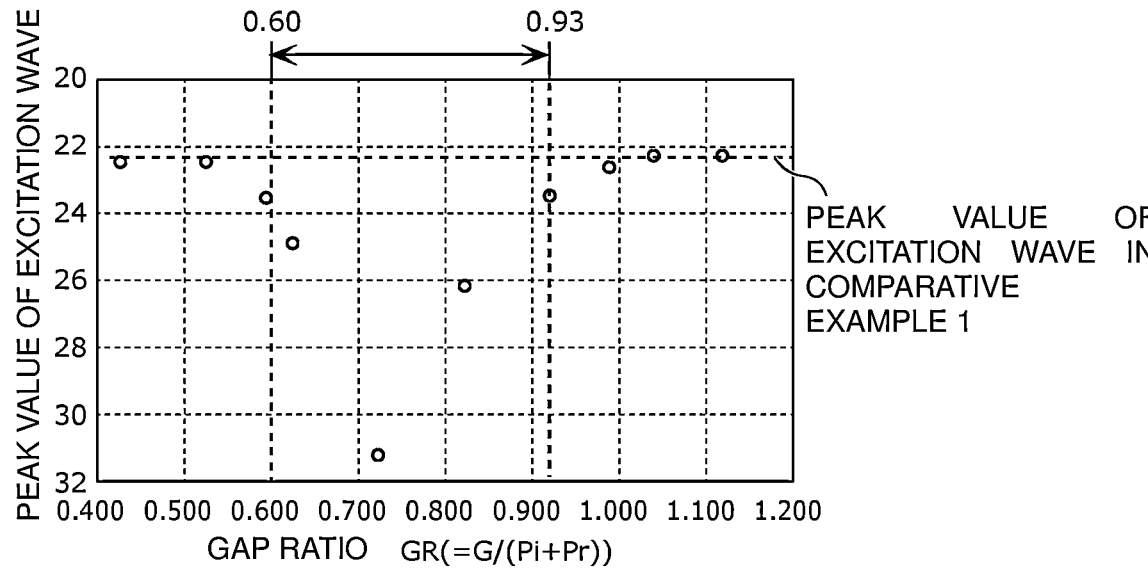
FIG. 9 is a graph illustrating a relationship between an IDT-reflector gap and a peak value of an excitation wave.

FIG. 9 is a graph illustrating a relationship between the IDT-reflector gap G and a peak value of an excitation wave.

In FIG. 9, the horizontal axis represents gap ratio GR ($=G/(Pi+Pr)$) obtained by making the IDT-reflector gap G dimensionless. The gap ratio GR represented by the horizontal axis is a value obtained when the IDT-reflector gap G is changed with Pi+Pr fixed. In FIG. 9, the vertical axis represents peak value of an excitation wave that occurs at a frequency higher than the pass band. A dashed line extending in a horizontal direction represents a peak value (about 22.3 dB) of the excitation wave in Comparative Example 1 illustrated in FIG. 8.

As illustrated in FIG. 9, when the gap ratio GR ($=G/(Pi+Pr)$) is set in a range of about 0.60 to about 0.93 inclusive, a peak value of an excitation wave can be made smaller than that in Comparative Example 1. This range of the gap ratio GR can make acoustic wave phases based on the IDTs 31 and 32 different from acoustic wave phases based on the reflectors 41 and 42 and keep the acoustically-coupled resonator 25 of the additional circuit 20 from being over-excited. Thus, deterioration of attenuation characteristics outside the pass band of the acoustic wave filter 1 can be reduced. Furthermore, when the gap ratio GR is set in a range of about 0.63 to about 0.83 inclusive, a peak value of an excitation wave can be further reduced.

Although an example has been described above where the gap ratio GR ($=G/(Pi+Pr)$) is set in the range of about 0.60 to about 0.93 inclusive, the range of the gap ratio GR is not limited to this.

Figure 10:
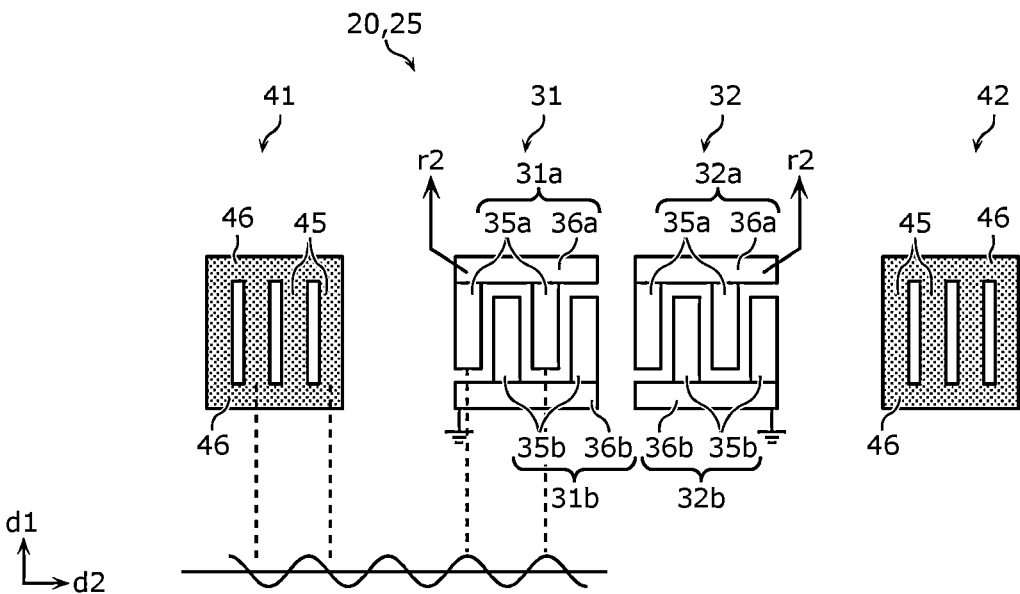
FIG. 10 illustrates another example of an additional circuit included in an acoustic wave filter according to a preferred embodiment of the present invention.

FIG. 10 illustrates another example of the additional circuit 20 included in the acoustic wave filter 1.

FIG. 10 illustrates an example where the IDT-reflector gap G in the additional circuit 20 illustrated in FIG. 1 is increased by one wavelength (the average of an IDT wavelength and a reflector wavelength=Pi+Pr). In this case as well, acoustic wave phases based on the IDTs 31 and 32 can be made different from acoustic wave phases based on the reflectors 41 and 42 as in Practical Example. Incidentally, an acoustic wave has periodicity, and thus the length by which the IDT-reflector gap G is increased is not limited to one wavelength and may be two or more wavelengths. That is, in the additional circuit 20 of the acoustic wave filter 1, a relationship of about $0.60+n \leq G/(Pi+Pr) \leq 0.93+n$ s satisfied true, where n is an integer of 0 or more.

In this configuration as well, advantageous effects the same as or similar to those in Practical Example can be provided.

Other Preferred Embodiments

Acoustic wave filters and so forth according to preferred embodiments of the present invention have been described above. The present invention also encompasses other preferred embodiments achieved by combining any components in the above-described preferred embodiments, modifications obtained by making various modifications conceived by a person skilled in the art to the above-described preferred embodiments within the scope of the gist of the present invention, and a radio frequency front-end circuit and a communication device that each include an acoustic wave filter or multiplexer according to the present invention.

Although an example has been described above where the plurality of IDTs 31 and 32 are two IDTs, the plurality of IDTs 31 and 32 are not limited to this, and a plurality of IDTs may be three or more IDTs.

Although an example has been described where, in the above-described acoustically-coupled resonator 25, the IDT 31 and the IDT 32 are arranged in sequence along the second direction d2, the arrangement is not limited to this. For example, the IDT 32 and the IDT 31 may be arranged in that order along the second direction d2.

Although an example has been described where, in the above-described acoustically-coupled resonator 25, the first electrode finger group 37 in the IDT 31, the second electrode finger group 38 in the IDT 31, the second electrode finger group 38 in the IDT 32, and the first electrode finger group 37 in the IDT 32 are arranged in sequence along the second direction d2, the arrangement is not limited to this. For example, in the second direction d2, the order in which the first electrode finger group 37 and the second electrode finger group 38 in the IDT 31 are arranged and the order in which the second electrode finger group 38 and the first electrode finger group 37 in the IDT 32 are arranged may be reversed.

Although an example has been described where, in FIGS. 6 and 7 described above, the IDTs 31 and 32 and the reflectors 41 and 42 are the same or substantially the same in duty, duty is not limited to this. For example, as for a duty distribution, the reflector 41, the IDT 31, the IDT 32, and the reflector 42 may vary discontinuously in duty such that duty in each of the reflector 41, the IDT 31, the IDT 32, and the reflector 42 is irregularly increased or decreased toward the second direction d2.

Although an example has been described above where the pass band of the acoustic wave filter 1 is set to be lower than the pass band of the second filter circuit 90, the pass band of the acoustic wave filter 1 is not limited to this. The pass band of the acoustic wave filter 1 may be set to be higher than the pass band of the second filter circuit 90. This configuration can provide an acoustic wave filter that makes it possible to reduce or prevent deterioration of attenuation characteristics on a lower-frequency side than its pass band.

Although an example has been described above where the acoustic wave filter 1 is a transmission filter, the acoustic wave filter 1 is not limited to this. The acoustic wave filter 1 may be a reception filter. Furthermore, the multiplexer 5 is not limited to a configuration in which both a transmission filter and a reception filter are included, and the multiplexer 5 may have a configuration in which only a plurality of transmission filters or only a plurality of reception filters are included.

Furthermore, although, as an example, the multiplexer including two filters has been described above, the present invention can also be applied, for example, to a triplexer in which a common antenna terminal is provided for three filters, or a hexaplexer in which a common antenna terminal is provided for six filters. That is, the multiplexer only has to include two or more filters.

Furthermore, the second filter circuit 90 is not limited to the above-described filter configuration and can be appropriately designed, for example, in accordance with demanded filter characteristics. Specifically, for example, the second filter circuit 90 may have a longitudinally coupled filter structure or may have a ladder filter structure. Furthermore, each resonator of the second filter circuit 90 is not limited to a SAW resonator and may be, for example, a bulk acoustic wave (BAW) resonator. Additionally, the second filter circuit 90 may be constructed without any resonators and may be, for example, an LC resonant filter or dielectric filter.

Furthermore, an IDT electrode included in each IDT does not have to have a laminated structure. The IDT electrode may be made of, for example, a metal, such as Ti, Al, Cu, Pt, Au, Ag, or Pd, or an alloy of the metal, or may include a plurality of multilayer bodies made of the above-described metal or alloy.

Furthermore, although a substrate having piezoelectricity has been described as a substrate in the preferred embodiments, this substrate may be a piezoelectric substrate including a single piezoelectric layer. The piezoelectric substrate in this case is made, for example, of a piezoelectric single crystal of LiTaO$_3$, or another piezoelectric single crystal of LiNbO$_3$ or the like. Furthermore, as for a substrate where an IDT electrode is provided, as long as the substrate has piezoelectricity, a structure in which a piezoelectric layer is laminated on a supporting substrate may be used in addition to a structure in which the entire or substantially the entire substrate is made of a piezoelectric layer. Additionally, a cut-angle of a substrate according to the above-described preferred embodiments is not limited. That is, a laminated structure, materials, and a thickness may be appropriately changed, for example, in accordance with demanded bandpass characteristics of an acoustic wave filter. Even a surface acoustic wave filter in which, for example, a LiTaO$_3$ piezoelectric substrate or LiNbO$_3$ piezoelectric substrate with a cut-angle other than the cut-angle described in the above-described preferred embodiments is used can achieve the same or similar advantageous effects.

The material of the low acoustic velocity film is not limited to the above. Examples of a material that can be used include glass, silicon oxide, silicon oxynitride, lithium oxide, tantalum oxide, a dielectric, such as a compound obtained by adding fluorine, carbon, or boron to silicon oxide, and materials including the above-described materials as a main component.

The material of the high acoustic velocity film is not limited to the above. Examples of a material that can be used include piezoelectric substances, such as aluminum nitride, lithium tantalate, lithium niobate, and crystal, ceramics, such as alumina, sapphire, magnesia, silicon nitride, silicon carbide, zirconia, cordierite, mullite, steatite, forsterite, spinel, and sialon, dielectrics, such as aluminum oxide, silicon oxynitride, diamond-like carbon (DLC), and diamond, a semiconductor, such as silicon, and materials including the above-described materials as a main component.

The above-described spinel includes aluminum compounds containing one or more elements selected, for example, from Mg, Fe, Zn, and Mn, and oxygen. Examples of the above-described spinel include MgAl$_2$O$_4$, FeAl$_2$O$_4$, ZnAl$_2$O$_4$, and MnAl$_2$O$_4$.

Example of a material of the supporting substrate that can be used include piezoelectric substances, such as aluminum nitride, lithium tantalate, lithium niobate, and crystal, ceramics, such as alumina, sapphire, magnesia, silicon nitride, silicon carbide, zirconia, cordierite, mullite, steatite, and forsterite, dielectrics, such as diamond, and glass, semiconductors, such as silicon, and gallium nitride, resins, and materials including the above-described materials as a main component.

In the specification, a main component refers to a component that includes over 50% by weight of a material.

A film made of any material may be provided between layers as long as the film has no significant effect on a surface acoustic wave that propagates. For example, between the piezoelectric layer and the low acoustic velocity film, a new high acoustic velocity film may be provided that is sufficiently thinner than a wavelength of a surface acoustic wave. For this new high acoustic velocity film as well, a material that is the same or substantially the same as that of the above-described high acoustic velocity film can be used.

Furthermore, the proportion of the number of reflector electrode fingers 45 in the plurality of reflectors 41 and 42 included in the acoustic wave filter 1 according to the preferred embodiments may be, for example, not greater than about 11% of the total number, which is the sum of the number of comb-shaped electrode fingers 35a and 35b in the plurality of IDTs 31 and 32 and the number of reflector electrode fingers 45 in the plurality of reflectors 41 and 42.

Thus, when the proportion of the number of reflector electrode fingers 45 in the additional circuit 20 is not greater than about 11% of the total number of comb-shaped electrode fingers 35a and 35b and reflector electrode fingers 45, a resonance Q of the additional circuit 20 can be prevented from being increased more than necessary. This can reduce or prevent an unwanted wave from being generated outside the frequency pass band of the acoustic wave filter 1 and provide attenuation outside the frequency pass band.

Preferred embodiments of the present invention can be widely used, for example, as a multiplexer, a front-end circuit, and a communication device that each include an acoustic wave filter, in communication equipment, such as mobile phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
an input terminal and an output terminal;
a filter circuit on a first path connecting the input terminal and the output terminal; and
an additional circuit on a second path connected in parallel with at least a portion of the first path; wherein
the additional circuit includes an acoustically-coupled resonator including a plurality of interdigital transducers (IDTs) and a plurality of reflectors;
the plurality of IDTs each include a pair of comb-shaped electrodes on a piezoelectric substrate;
each of the comb-shaped electrodes includes a plurality of comb-shaped electrode fingers extending in a first direction parallel or substantially parallel to a main surface of the piezoelectric substrate and extending along a second direction intersecting the first direction;
the plurality of IDTs are arranged along the second direction;

the plurality of reflectors are located on both outer sides of the plurality of IDTs in the second direction and each includes a plurality of reflector electrode fingers extending in the first direction and arranged along the second direction;

a relationship of about $0.60+n \leq G/(Pi+Pr) \leq 0.93+n$ is satisfied, where n is an integer of 0 or more, Pi denotes an array pitch of the plurality of comb-shaped electrode fingers arranged along the second direction, Pr denotes an array pitch of the plurality of reflector electrode fingers arranged along the second direction, and G denotes, in a boundary region between one of the plurality of IDTs and one of the plurality of reflectors adjacent to the IDT, an IDT-reflector gap, which is a center-to-center distance between one of the plurality of comb-shaped electrode fingers closest to the reflector and one of the plurality of reflector electrode fingers closest to the IDT; and a value of Pi is different from a value of Pr.

2. An acoustic wave filter comprising:

an input terminal and an output terminal;

a filter circuit on a first path connecting the input terminal and the output terminal; and an additional circuit on a second path connected in parallel with at least a portion of the first path; wherein the additional circuit includes an acoustically-coupled resonator including a plurality of interdigital transducers (IDTs) and a plurality of reflectors;

the plurality of IDTs each include a pair of comb-shaped electrodes on a piezoelectric substrate;

each of the comb-shaped electrodes includes a plurality of comb-shaped electrode fingers extending in a first direction parallel or substantially parallel to a main surface of the piezoelectric substrate and extending along a second direction intersecting the first direction;

the plurality of IDTs are arranged along the second direction;

the plurality of reflectors are located on both outer sides of the plurality of IDTs in the second direction and each includes a plurality of reflector electrode fingers extending in the first direction and arranged along the second direction;

a relationship of about $0.60+n \leq G/(Pi+Pr) \leq 0.93+n$ is satisfied, where n is an integer of 0 or more, Pi denotes an array pitch of the plurality of comb-shaped electrode fingers arranged along the second direction, Pr denotes an array pitch of the plurality of reflector electrode fingers arranged along the second direction, and G denotes, in a boundary region between one of the plurality of IDTs and one of the plurality of reflectors adjacent to the IDT, an IDT-reflector gap, which is a center-to-center distance between one of the plurality of comb-shaped electrode fingers closest to the reflector and one of the plurality of reflector electrode fingers closest to the IDT; and array pitches of the plurality of comb-shaped electrode fingers and array pitches of the plurality of reflector electrode fingers vary discontinuously in the second direction.

3. The acoustic wave filter according to claim 2, wherein each of the plurality of IDTs includes a plurality of electrode finger groups having different array pitches of the plurality of comb-shaped electrode fingers.

4. The acoustic wave filter according to claim 1, wherein a reactance element is provided between the additional circuit and the filter circuit.

5. The acoustic wave filter according to claim 1, wherein a first IDT of the plurality of IDTs is connected to the second path on one side, and a second IDT of the plurality of IDTs different from the first IDT is connected to the second path on another side.

6. The acoustic wave filter according to claim 1, wherein each of the pair of comb-shaped electrodes include a close contact layer and a main electrode layer.

7. The acoustic wave filter according to claim 6, wherein the close contact layer includes Ti.

8. The acoustic wave filter according to claim 6, wherein the main electrode layer has a laminated structure including a first Ti layer, an AlCu layer, and a second Ti layer.

9. The acoustic wave filter according to claim 8, wherein the first Ti layer has a thickness of about 30 nm;

the AlCu layer has a thickness of about 425 nm; and the second Ti layer has a thickness of about 4 nm.

10. The acoustic wave filter according to claim 6, wherein each of the pair of comb-shaped electrodes is covered by a protective film.

11. A multiplexer comprising:

the acoustic wave filter according to claim 1; and another filter circuit having a pass band different from a pass band of the acoustic wave filter.

12. The multiplexer according to claim 11, wherein array pitches of the plurality of comb-shaped electrode fingers and array pitches of the plurality of reflector electrode fingers vary discontinuously in the second direction.

13. The multiplexer according to claim 12, wherein each of the plurality of IDTs includes a plurality of electrode finger groups having different array pitches of the comb-shaped electrode fingers.

14. The multiplexer according to claim 11, wherein a reactance element is provided between the additional circuit and the filter circuit.

15. The multiplexer according to claim 11, wherein a first IDT of the plurality of IDTs is connected to the second path on one side, and second IDT of the plurality of IDTs different from the first IDT is connected to the second path on another side.

16. The multiplexer according to claim 11, wherein each of the pair of comb-shaped electrodes include a close contact layer and a main electrode layer.

17. The multiplexer according to claim 16, wherein the close contact layer includes Ti.

18. The multiplexer according to claim 16, wherein the main electrode layer has a laminated structure including a first Ti layer, an AlCu layer, and a second Ti layer.

19. The multiplexer according to claim 18, wherein the first Ti layer has a thickness of about 30 nm;

the AlCu layer has a thickness of about 425 nm; and the second Ti layer has a thickness of about 4 nm.

20. The multiplexer according to claim 16, wherein each of the pair of comb-shaped electrodes is covered by a protective film.

* * * * *